(12) United States Patent
Jung

(10) Patent No.: US 11,171,407 B2
(45) Date of Patent: Nov. 9, 2021

(54) ELECTRONIC DEVICE, AND METHOD FOR CONTROLLING AMPLIFIER ON BASIS OF STATE OF ELECTRONIC DEVICE

(71) Applicant: Samsung Electronics Co., Ltd., Gyeonggi-do (KR)

(72) Inventor: Hojin Jung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/631,922

(22) PCT Filed: Jul. 24, 2018

(86) PCT No.: PCT/KR2018/008336
§ 371 (c)(1),
(2) Date: Jan. 17, 2020

(87) PCT Pub. No.: WO2019/031731
PCT Pub. Date: Feb. 14, 2019

(65) Prior Publication Data
US 2020/0176854 A1 Jun. 4, 2020

(30) Foreign Application Priority Data
Aug. 10, 2017 (KR) .......................... 10-2017-0101482

(51) Int. Cl.
*H01Q 1/24* (2006.01)
*H03F 1/30* (2006.01)
(Continued)

(52) U.S. Cl.
CPC .............. *H01Q 1/243* (2013.01); *H03F 1/30* (2013.01); *H03F 3/189* (2013.01); *H04M 1/0216* (2013.01)

(58) Field of Classification Search
CPC ...... H01Q 1/243; H04M 1/0216; H03F 3/189; H03F 1/30; H04B 7/02; H04B 7/08; H04B 7/0802; H04B 7/0805; H04B 7/0825
(Continued)

(56) References Cited

U.S. PATENT DOCUMENTS

| 5,649,306 A | 7/1997 | Vannatta et al. |
| 6,108,526 A * | 8/2000 | van der Plas .......... H01Q 3/005 455/277.1 |

(Continued)

FOREIGN PATENT DOCUMENTS

| EP | 1 124 337 A2 | 8/2001 |
| EP | 1445826 A2 | 8/2004 |

(Continued)

OTHER PUBLICATIONS

European Search Report dated Jul. 14, 2020.

*Primary Examiner* — Lee Nguyen
(74) *Attorney, Agent, or Firm* — Cha & Reiter, LLC

(57) ABSTRACT

The present invention relates to an electronic device and a method for controlling an amplifier on the basis of the state of the electronic device. According to various embodiments of the present invention, the electronic device comprises: a first antenna for transmitting and receiving a wireless signal; a second antenna for receiving the wireless signal and including a low noise amplifier (LNA) for amplifying the received wireless signal; and a processor electrically connected to the first antenna and the second antenna. The processor can be configured to control the LNA of the second antenna to be at least temporarily turned off during transmission of the wireless signal through the first antenna when the electronic device is in a first state. Various embodi-
(Continued)

ments other than the various embodiments disclosed in the present invention are possible.

12 Claims, 9 Drawing Sheets

(51) Int. Cl.
  *H03F 3/189* (2006.01)
  *H04M 1/02* (2006.01)
(58) Field of Classification Search
  USPC .......................... 455/272–273, 277.1–277.2
  See application file for complete search history.

(56) References Cited

U.S. PATENT DOCUMENTS

| | | |
|---|---|---|
| 6,625,202 B1 | 9/2003 | Sudo et al. |
| 2004/0229665 A1 | 11/2004 | Mori |
| 2005/0107043 A1* | 5/2005 | Avasarala ............ H04B 7/0805 455/78 |
| 2011/0169712 A1 | 7/2011 | Sumi et al. |
| 2011/0312287 A1 | 12/2011 | Ramachandran et al. |
| 2015/0230009 A1 | 8/2015 | Choi et al. |
| 2016/0081026 A1 | 3/2016 | Jun et al. |

FOREIGN PATENT DOCUMENTS

| | | |
|---|---|---|
| GB | 2293277 A | 3/1996 |
| JP | 2000-31889 A | 1/2000 |
| JP | 2001-168779 A | 6/2001 |
| KR | 10-2005-0060509 A | 6/2005 |
| KR | 10-2006-0025280 A | 3/2006 |
| KR | 10-2009-0007969 A | 1/2009 |
| KR | 10-2014-0036103 A | 3/2014 |
| KR | 10-2014-0099140 A | 8/2014 |
| KR | 10-2015-0000125 A | 1/2015 |
| KR | 10-2016-0030673 A | 3/2016 |

* cited by examiner

ELECTRONIC DEVICE, AND METHOD FOR CONTROLLING AMPLIFIER ON BASIS OF STATE OF ELECTRONIC DEVICE

CROSS REFERENCE TO RELATED APPLICATIONS

This application is a National Phase Entry of PCT International Application No. PCT/KR2018/008336, which was filed on Jul. 24, 2018, and claims a priority to Korean Patent Application No. 10-2017-0101482, which was filed on Aug. 10, 2017, the contents of which are incorporated herein by reference.

TECHNICAL FIELD

Various embodiments of the disclosure relate to a method for controlling an amplifier based on a state of an electronic device.

BACKGROUND ART

An electronic device includes in general an antenna for wireless communication. The antenna used for the wireless communication performs a function of transmitting or receiving a wireless communication signal of a specific frequency band. The antenna may radiate the signal evenly in all directions so that the transmission and reception function is not degraded by a propagation loss of the signal due to obstacles or the like. The performance of performing a wireless communication function in the electronic device may be determined according to the radiation characteristics of the antenna.

DISCLOSURE OF INVENTION

Technical Problem

The antenna radiation performance may be deteriorated when a signal transmitted from an antenna located inside the electronic device to the outside is distorted at least partially due to an obstacle or the like. For example, such a signal transmitted from the antenna to the outside may be induced to another antenna located inside the electronic device due to an obstacle or the like. The signal induced to another antenna is amplified by a low noise amplifier (LNA) included in that antenna, thus causing radiation spurious emission (RSE).

According to various embodiments of the disclosure, the electronic device may control the operation of an antenna so that antenna radiation performance is not degraded. Specifically, when transmitting a wireless signal through one antenna, the electronic device may control the LNA included in another antenna located inside the electronic device so that the transmitted signal is not amplified even though induced to another antenna due to an obstacle or the like.

Solution to Problem

According to various embodiments of the disclosure, an electronic device may include a first antenna transmitting and receiving a wireless signal, a second antenna receiving the wireless signal and including a low noise amplifier (LNA) for amplifying the received wireless signal, and a processor electrically connected to the first antenna and the second antenna. The processor may be configured to control the LNA of the second antenna to be turned off at least temporarily during transmission of the wireless signal through the first antenna when the electronic device is in a first state.

According to various embodiments of the disclosure, a method for controlling an amplifier based on a state of an electronic device may include receiving a wireless signal through at least one of a first antenna and a second antenna, and controlling a low noise amplifier (LNA) of the second antenna to be turned off at least temporarily during transmission of the wireless signal through the first antenna when the electronic device is in a first state.

According to various embodiments of the disclosure, an electronic device may include a folder part, a main part connected to the folder part through a hinge part and overlapped with at least a portion of the folder part when the folder part is closed, a sensor unit for detecting a closed state of the folder part, a first antenna for transmitting or receiving a signal, a second antenna for receiving a signal, a communication module for performing communication using the first and second antennas, an amplifier disposed between the second antenna and the communication module and amplifying the signal received through the second antenna, and a processor configured to acquire information associated with the closed state of the folder part by using the sensor unit, and to control the amplifier to be turned off at least temporarily when the closed state satisfies a predetermined condition.

Advantageous Effects of Invention

According to various embodiments of the disclosure, the electronic device may control the LNA included in another antenna when transmitting a wireless signal through one antenna. By controlling the LNA, it is possible to prevent the transmitted signal from being induced to another antenna and amplified through the LNA, thereby improving the RSE.

MODE FOR THE INVENTION

Figure 1:
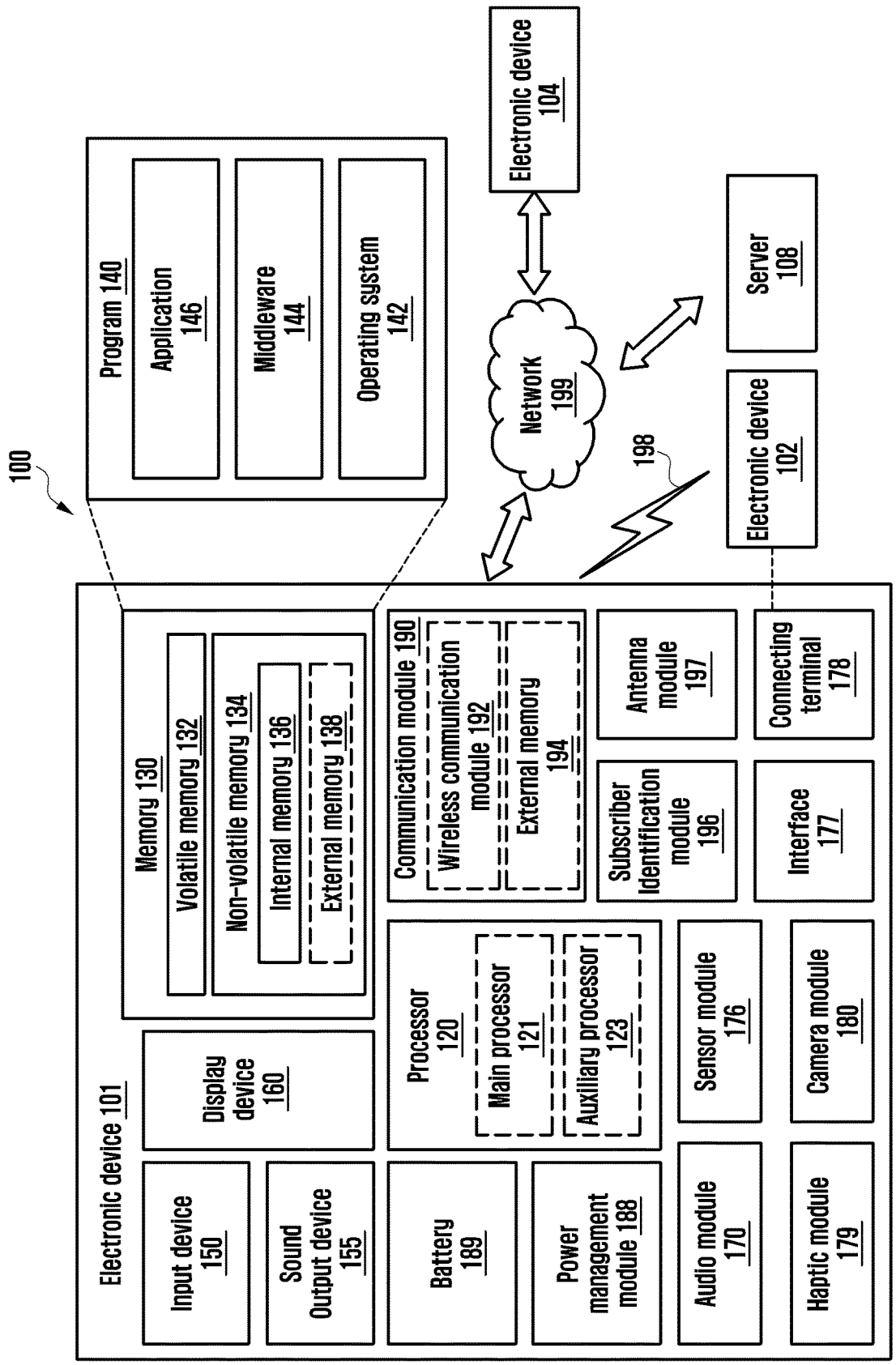
FIG. 1 is a block diagram illustrating an electronic device in a network environment according to various embodiments.

FIG. 1 is a block diagram illustrating an electronic device in a network environment according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. The auxiliary processor 123 may be implemented as separate from, or as embedded in the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102) (e.g., speaker or headphone) directly via a wire or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly via a wire or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may include one or more antennas for transmitting or receiving a signal or power to or from the outside. According to an embodiment, the communication module 190 (e.g., the wireless communication module 192) may transmit a signal to or receive a signal from an external electronic device through an antenna suitable for a communication scheme.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
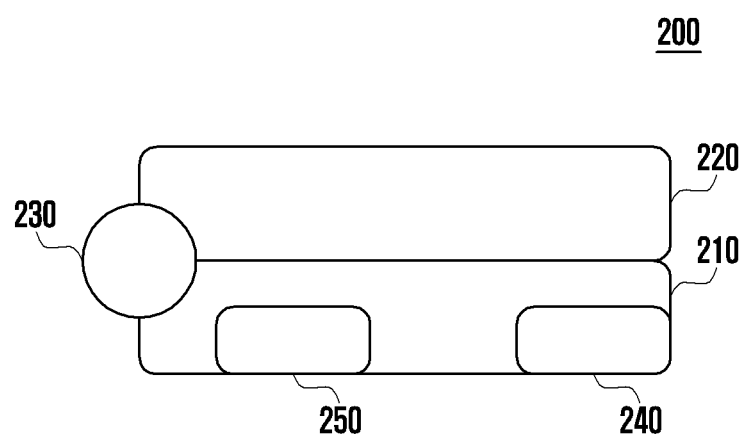
FIGS. 2A and 2B are diagrams illustrating states of an electronic device according to various embodiments of the disclosure.
Figure 2B:
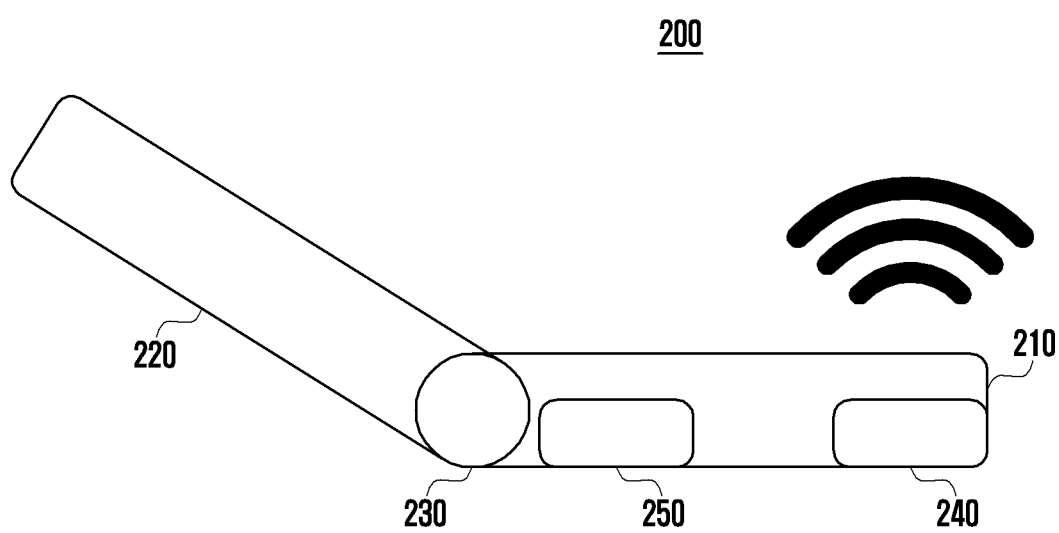

FIGS. 2A and 2B are diagrams illustrating states of an electronic device according to various embodiments of the disclosure.

Referring to FIGS. 2A and 2B, the electronic device 200 (e.g., the electronic device 101 in FIG. 1) may have a folder-type structure. The electronic device 200 of the folder-type structure may include a main part 210, a folder part 220, and a hinge part 230.

In an embodiment, the appearance of the electronic device 200 may be formed of metal.

In an embodiment, the main part 210 may include at least one antenna, for example, a first antenna 240 and a second antenna 250. The first antenna 240 may be disposed at a lower portion of the main part 210. The second antenna 250 may be disposed at an upper portion of the main part 210.

In an embodiment, the electronic device 200 may transmit/receive a wireless signal through the first antenna 240 disposed at the lower portion of the main part 210. In addition, the electronic device 200 may receive the wireless signal through the second antenna 250 disposed at the upper portion of the main part 210. The second antenna 250 may be a reception-only antenna for receiving the wireless signal. For example, the electronic device 200 may receive the wireless signal through two antennas, i.e., the first antenna 240 and the second antenna 250. Receiving the wireless signal through the two antennas, i.e., the first and second antennas 240 and 250 may improve the reception performance of the electronic device in comparison with receiving the wireless signal through one antenna.

In an embodiment, when transmitting a wireless signal, the electronic device 200 may radiate the transmission signal through the first antenna 240.

In an embodiment, the folder part 220 may include a touch screen display (e.g., the display device 160 in FIG. 1) on one surface or both surfaces thereof.

In an embodiment, the hinge part 230 is interposed between the main part 210 and the folder part 220 and is capable of connecting the main part 210 and the folder part 220. The hinge part 230 is rotatable to open or close the folder part 220.

In an embodiment, the electronic device 200 may detect through a sensor unit whether the folder part 220 is opened or closed.

In an embodiment, when the electronic device 200 detects through the sensor unit that the folder part 220 is closed by the hinge part 230 as shown in FIG. 2A, it may be determined that the electronic device 200 is in a first state (e.g., a closed state). For example, when the folder part 220 is in a state of being overlapped with at least a portion of the main part 210, the electronic device 200 may be determined to be in the first state.

In an embodiment, when radiating a transmission signal through the first antenna 240 in the first state, the electronic device 200 may control an amplifier (e.g., a low noise amplifier (LNA)) of the second antenna 250.

The operation of controlling the LNA of the second antenna 250 will be described below in detail with reference to FIGS. 4 to 7B.

In an embodiment, when the electronic device 200 detects through the sensor unit that the folder part 220 is opened by the hinge part 230 as shown in FIG. 2B, it may be determined that the electronic device 200 is in a second state (e.g., an open state). For example, when the folder part 220 is in a state of being not overlapped with at least a portion of the main part 210, the electronic device 200 may be determined to be in the second state.

Figure 3:
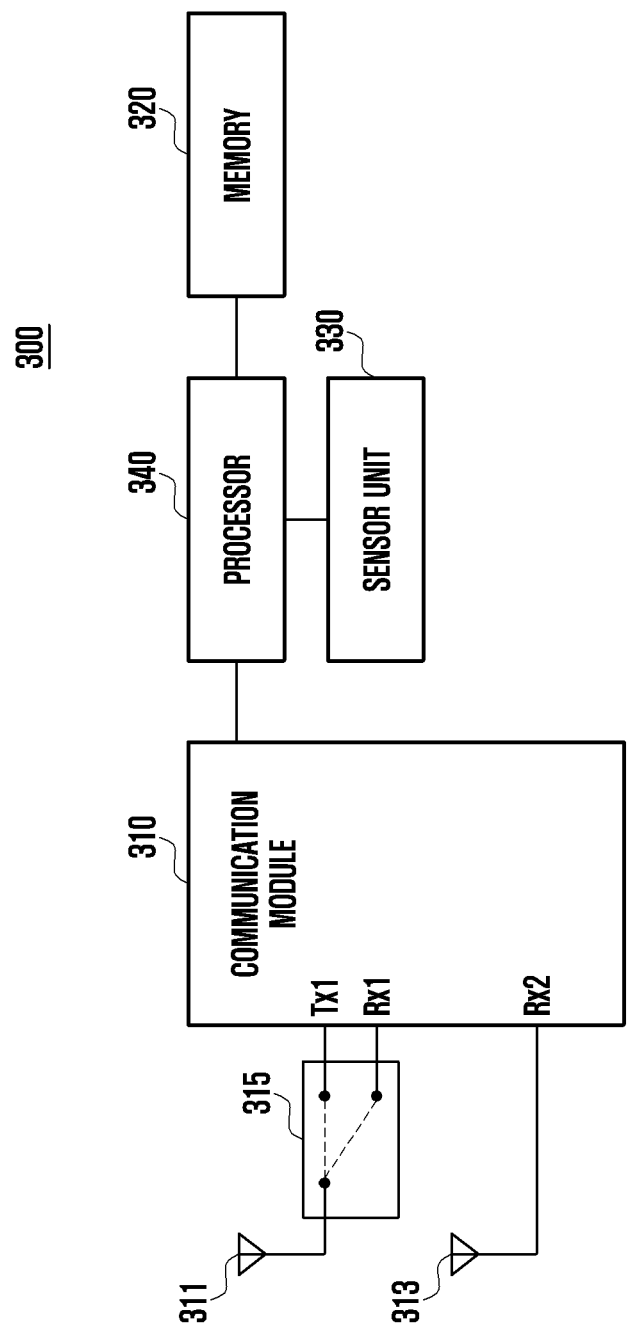
FIG. 3 is a block diagram illustrating an electronic device according to various embodiments of the disclosure.

FIG. 3 is a block diagram illustrating an electronic device according to various embodiments of the disclosure.

Referring to FIG. 3, the electronic device 300 (e.g., the electronic device 200 in FIG. 2) may include a communication module 310 (e.g., the communication module 190 in FIG. 1), a memory 320 (e.g., the memory 130 in FIG. 1), a sensor unit 330 (e.g., the sensor module 176 in FIG. 1), and a processor 340 (e.g., the processor 120 in FIG. 1).

According to various embodiments of the disclosure, the communication module 310 (e.g., the communication module 190 in FIG. 1) may perform communication between the electronic device 300 (e.g., the electronic device 200 in FIG. 2) and an external electronic device (e.g., the electronic device 102 or 104 in FIG. 1) or a server (e.g., the server 108 in FIG. 1). For example, the communication module 310 may communicate with the external electronic device or the server by being connected to a network through wireless communication (e.g., the wireless communication module 192 in FIG. 1) or wired communication (e.g., the wired communication module 194 in FIG. 1). The wireless communication may include, for example, wireless fidelity (Wi-Fi), Bluetooth (BT), near field communication (NFC), and the like. In addition, the wireless communication may include cellular communication (e.g., LTE, LTE-A, CDMA, WCDMA, UMTS, WIBRO, GSM, CSD, CDPD, iDEN, or PDC). The wired communication may include, for example, at least one of a universal serial bus (USB), a high definition multimedia interface (HDMI), a recommended standard 232 (RS-232), or a plain old telephone service (POTS).

In an embodiment, the communication module 310 may include a first antenna 311 and a second antenna 313.

In an embodiment, the communication module 310 may transmit and receive a wireless signal through the first antenna 311. For example, the wireless signal may be based on a time division multiple access (TDMA) scheme.

In an embodiment, the communication module 310 may receive a wireless signal via a path corresponding to a reception end (Rx1) of the first antenna 311 switched through a switch unit 315, based on the TDMA scheme. On the path corresponding to the reception end (Rx1) of the first antenna 311, a low noise amplifier (LNA) for amplifying the received wireless signal and minimizing noise may be included.

In an embodiment, the communication module 310 may transmit a wireless signal via a path corresponding to a transmission end (Tx1) of the first antenna 311 switched through the switch unit 315 at a given time point, based on the TDMA scheme. On the path corresponding to the transmission end (Tx1) of the first antenna 311, a power amplifier (PA) for amplifying the wireless signal to be transmitted may be included.

In an embodiment, the communication module 310 may receive a wireless signal via a path corresponding to a reception end (Rx2) of the second antenna 313. The second antenna 313 may be used for reception only of the wireless signal. On the path corresponding to the reception end (Rx2) of the second antenna 313, a low noise amplifier (LNA) for amplifying the received wireless signal and minimizing noise may be included.

According to various embodiments of the disclosure, the memory 320 (e.g., the memory 130 in FIG. 1) may store a switch control program for controlling the switch unit 315. The memory 320 may store a program for controlling the LNA of the second antenna 313 in accordance with the state of the electronic device 300. The memory 320 may store a reference value for determining whether the received signal strength is low or high. The memory 320 may store a program for controlling the LNA of the second antenna 313, based on the state of the electronic device 300 and the received signal strength.

According to various embodiments of the disclosure, the sensor unit 330 (e.g., the sensor module 176 in FIG. 1) may detect a state of the electronic device 300. For example, the sensor unit 330 may detect whether the folder part (e.g., the folder part 220 in FIGS. 2A and 2B) of the electronic device 300 is opened or closed. For example, using at least one of a proximity sensor, an infrared (IR) sensor, or an illuminance sensor, the sensor unit 330 may detect whether the folder part of the electronic device 300 is opened or closed. The sensor unit 330 may be embedded in the touch screen display (e.g., the display device 160 in FIG. 1) disposed on one surface or both surfaces of the folder part of the electronic device 300.

According to various embodiments of the disclosure, the processor 340 (e.g., the processor 120 in FIG. 1) may control the overall operation of the electronic device 300 and a signal flow between internal components of the electronic device 300, perform data processing, and control supplying power from a battery (e.g., battery 189 in FIG. 1) to the components.

According to various embodiments of the disclosure, the processor 340 may receive a wireless signal through the communication module 310. For example, the wireless signal may be received using at least one of the first antenna 311 and the second antenna 313. The processor 340 may determine whether the electronic device 300 is in a first state (e.g., a state where the folder part (e.g., the folder part 220 in FIGS. 2A and 2B) of the electronic device 300 is overlapped with at least a portion of the main part (e.g., the main part 210 in FIGS. 2A and 2B)) or in a second state (e.g., a state where the folder part (e.g., the folder part 220 in FIGS. 2A and 2B) of the electronic device 300 is not overlapped with at least a portion of the main part (e.g., the main part 210 in FIGS. 2A and 2B)). When it is determined that the electronic device 300 is in the first state, the processor 340 may control the LNA of the second antenna 313 to be turned off at least temporarily when transmitting a wireless signal through the first antenna 311.

In an embodiment, based on the state of the electronic device 300 and the received signal strength, the processor 340 may control the LNA of the second antenna 313 to be turned off at least temporarily. For example, the processor 340 may measure the strength of the received wireless signal. Then, in order to determine whether the received signal strength is low or high, the processor 340 may compare the measured strength with a reference value. If the measured strength is less than or equal to the reference value, the processor 340 may determine the received signal strength to be low. Then, the processor 340 may control the LNA of the second antenna 313 to be turned off at least temporarily when transmitting a wireless signal through the first antenna 311, and may control the LNA of the second antenna 313 to be turned on when receiving a wireless signal through the first antenna 311. If the measured strength exceeds the reference value, the processor 340 may determine the received signal strength to be high, and then control the LNA of the second antenna 313 to be turned off at least temporarily.

Figure 4:
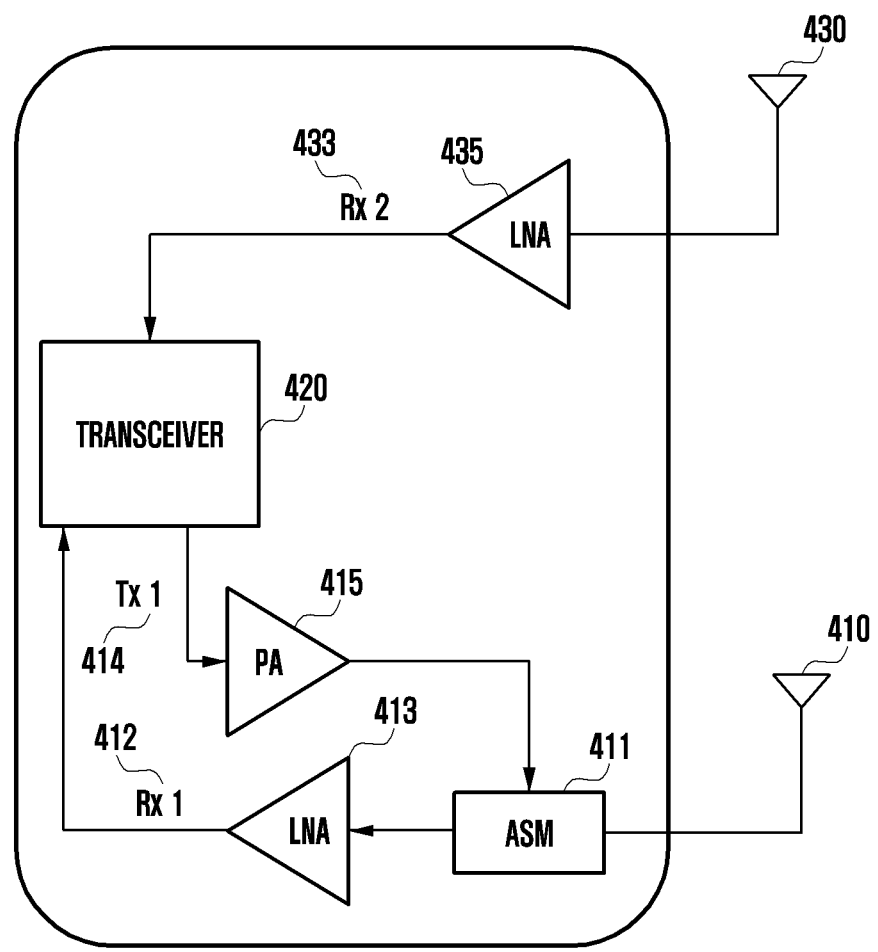
FIG. 4 is a diagram illustrating a configuration of an electronic device for an antenna control method according to various embodiments of the disclosure.

FIG. 4 is a diagram illustrating a configuration of an electronic device for an antenna control method according to various embodiments of the disclosure.

Referring to FIG. 4, a communication module (e.g., the communication module 310 in FIG. 3) of an electronic device (e.g., the electronic device 300 in FIG. 3) may include a first antenna 410 (e.g., the first antenna 311 in FIG. 3) and a second antenna 430 (e.g., the second antenna 313 in FIG. 3). The first antenna 410 may transmit and receive a wireless signal. The second antenna 430 may be a reception-only antenna for receiving a wireless signal.

In an embodiment, the wireless signal may be received through at least one of the first antenna 410 and the second antenna 430.

In an embodiment, the first antenna 410 may be disposed at a lower portion of a main part (e.g., the main part 210 in FIGS. 2A and 2B) of the electronic device in consideration of a specific absorption rate (SAR). In an embodiment, the second antenna 430 may be disposed at an upper portion of the main part of the electronic device.

In an embodiment, the wireless signal may be based on a time division multiple access (TDMA) scheme.

In an embodiment, when the wireless signal based on the TDMA scheme is received, a processor (e.g., the processor 340 in FIG. 3) may control an antenna switch module (ASM) 411 (e.g., the switch unit 315 in FIG. 3) to be connected to a path 412 corresponding to a reception end (Rx1) of the TDMA scheme.

In an embodiment, on the path 412 corresponding to the reception end (Rx1), a low noise amplifier (LNA) 413 for amplifying the received wireless signal and minimizing noise may be included.

In an embodiment, the wireless signal based on the TDMA scheme may be received via a path 433 corresponding to a reception end (Rx2) of the second antenna 430. On the path 433 corresponding to the reception end (Rx2) of the second antenna 430, an LNA 435 for amplifying the received wireless signal and minimizing noise may be included.

In an embodiment, a transceiver 420 may modulate signals to be transmitted through the first antenna 410 and demodulate signals received through at least one of the first antenna 410 and the second antenna 430.

In an embodiment, when a wireless signal is transmitted at a given time point, the processor may control the antenna switch module 411 to be connected to a path 414 corresponding to a transmission end (Tx1) of the TDMA scheme.

In an embodiment, on the path 414 corresponding to the transmission end (Tx1), a power amplifier (PA) 415 for amplifying the wireless signal may be included In an embodiment, when the electronic device transmits a wireless signal via the path 414 corresponding to the transmission end (Tx1) of the first antenna 410 in a first state (e.g., a state where a folder part (e.g., the folder part 220 in FIGS. 2A and 2B) of the electronic device is overlapped with at least a portion of a main part (e.g., the main part 210 in FIGS. 2A and 2B)), the transmitted wireless signal may be induced to the path 433 corresponding to the reception end (Rx2) of the second antenna 430. Then, the signal induced to the path 433 corresponding to the reception end (Rx2) of the second antenna 430 may be amplified by the LNA 435 of the second antenna 430. This may cause a harmonic component of the original wireless signal, and further cause a radiation spurious emission (RSE) problem.

In an embodiment, when transmitting a wireless signal through the first antenna 410 in the first state, the electronic device may control the LNA 435 included in the path 433 corresponding to the reception end (Rx2) of the second antenna 430 to be turned off at least temporarily. This control may prevent the wireless signal transmitted via the path 414 corresponding to the transmission end (Tx1) of the first antenna 410 from being induced to the path 433 corresponding to the reception end (Rx2) of the second antenna 430. Thus, the RSE problem can be improved.

For example, referring to Table 1 below, when the electronic device transmits a wireless signal via the path 414 corresponding to the transmission end (Tx1) of the first antenna 410 in the first state in case of a comparative example, the transmitted wireless signal is induced to the path 433 corresponding to the reception end (Rx2) of the second antenna 430, and thereby the RSE value is obtained as −34 to −35 dBm.

In an embodiment, the LNA 435 included in the path 433 corresponding to the reception end (Rx2) of the second antenna 430 is controlled to be turned off at least temporarily so that the LNA 435 does not amplify the wireless signal transmitted via the path 414 corresponding to the transmission end (Tx1) of the first antenna 410 and then induced to the path 433 corresponding to the reception end (Rx2) of the second antenna 430. As a result of this control, the RSE value is obtained as −43 dBm. That is, it can be seen that the RSE value according to the disclosure, −43 dBm, is improved about 10 dBm compared to the comparative example.

TABLE 1

|  | Comparative | Disclosure |
| --- | --- | --- |
| RSE in $1^{st}$ state | −34~−35 dBm | −43 dBm |
| RSE in $2^{nd}$ state | −43 dBm | −43 dBm |

Figure 5:
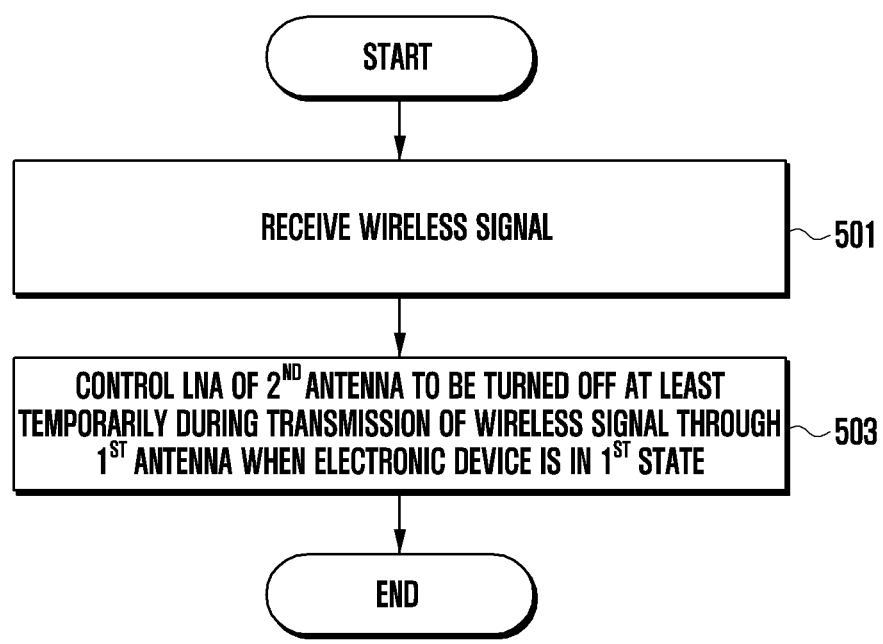
FIG. 5 is a flow diagram illustrating an antenna control method according to various embodiments of the disclosure.

FIG. 5 is a flow diagram illustrating an antenna control method according to various embodiments of the disclosure.

Referring to FIG. 5, a processor (e.g., the processor 340 in FIG. 3) may receive a wireless signal at operation 501. For example, the wireless signal may be received using at least one of a first antenna (e.g., the first antenna 410 in FIG. 4) and a second antenna (e.g., the second antenna 430 in FIG. 4).

In an embodiment, the received wireless signal may be based on a time division multiple access (TDMA) scheme.

In an embodiment, when an electronic device (e.g., the electronic device 300 in FIG. 3) is in a first state (e.g., a state where a folder part (e.g., the folder part 220 in FIGS. 2A and 2B) of the electronic device is overlapped with at least a portion of a main part (e.g., the main part 210 in FIGS. 2A and 2B)), the processor may control, at operation 503, a low noise amplifier (LNA) of a second antenna (e.g., the LNA 435 of the second antenna 430 in FIG. 4) to be turned off at least temporarily when transmitting a wireless signal through a first antenna.

In an embodiment, when the processor controls the LNA of the second antenna to be turned off at least temporarily so as to prevent the wireless signal transmitted through the first antenna from being induced to the second antenna, the RSE performance may be improved.

Figure 6:
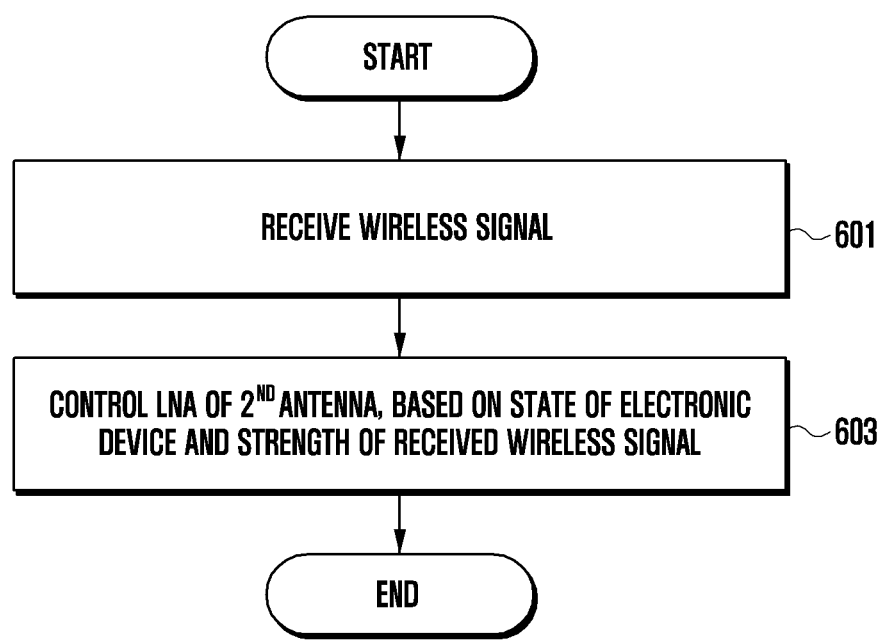
FIG. 6 is a flow diagram illustrating an antenna control method according to various embodiments of the disclosure.

FIG. 6 is a flow diagram illustrating an antenna control method according to various embodiments of the disclosure.

Referring to FIG. 6, a processor (e.g., the processor 340 in FIG. 3) may receive a wireless signal at operation 601. The received wireless signal may be based on a time division multiple access (TDMA) scheme.

In an embodiment, the wireless signal may be received using at least one of a first antenna (e.g., the first antenna 410 in FIG. 4) and a second antenna (e.g., the second antenna 430 in FIG. 4).

In an embodiment, the processor may control, at operation 603, a low noise amplifier (LNA) of the second antenna (e.g., the LNA 435 of the second antenna 430 in FIG. 4), based on a state of an electronic device (e.g., the electronic device 300 in FIG. 3) and the strength of the received wireless signal.

For example, based on whether the electronic device is in a first state (e.g., a state where a folder part (e.g., the folder part 220 in FIGS. 2A and 2B) of the electronic device is overlapped with at least a portion of a main part (e.g., the main part 210 in FIGS. 2A and 2B)) or in a second state (e.g., a state where the folder part of the electronic device is not overlapped with at least a portion of the main part), and based on whether the received signal strength exceeds a reference value, the processor may control at least temporarily the LNA of the second antenna to be turned off.

The operation 603 will be described in detail with reference to FIGS. 7A and 7B hereinafter.

Figure 7A:
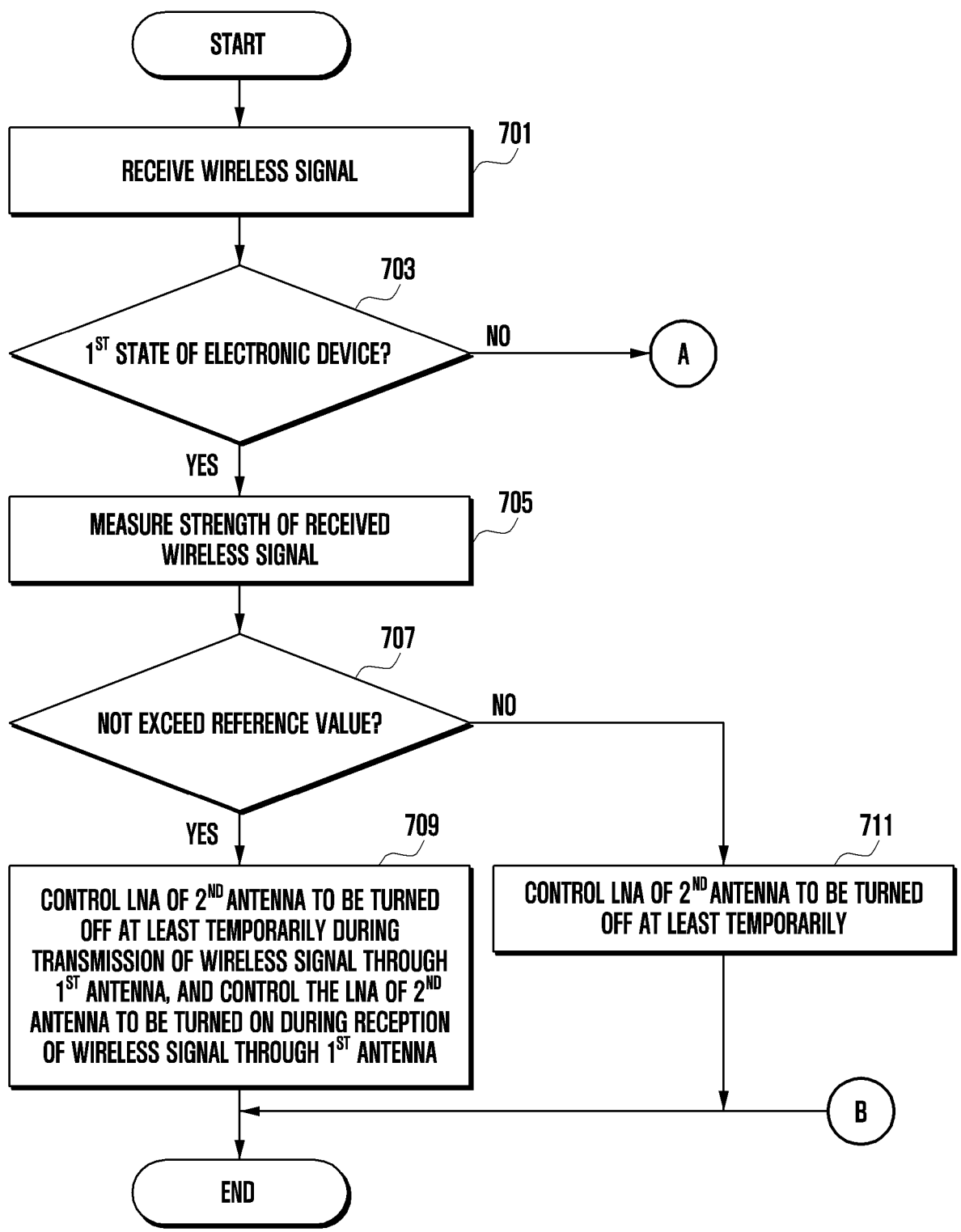
FIGS. 7A and 7B are flow diagrams illustrating an antenna control method according to various embodiments of the disclosure.
Figure 7B:
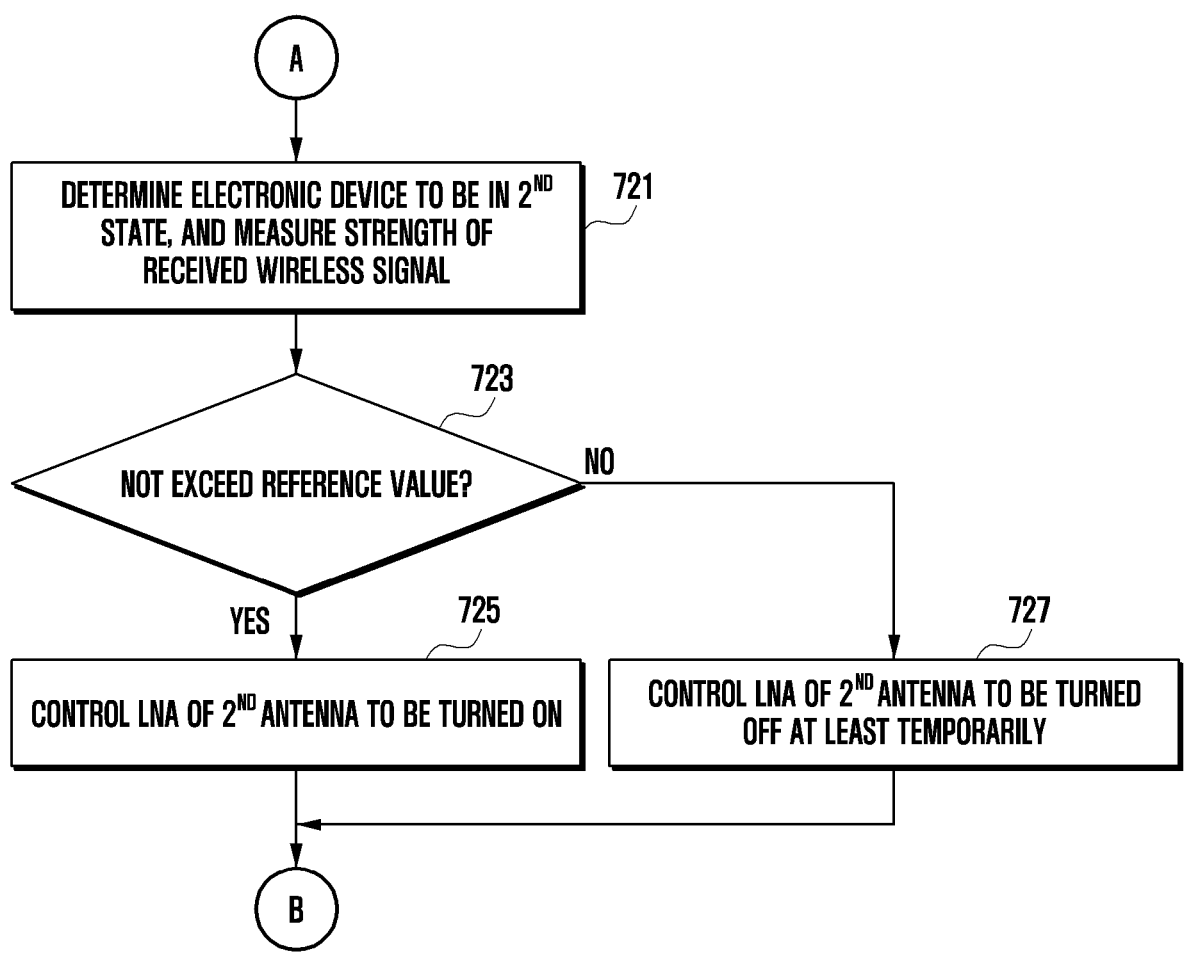

FIGS. 7A and 7B are flow diagrams illustrating an antenna control method according to various embodiments of the disclosure.

Referring to FIGS. 7A and 7B, a processor (e.g., the processor 340 in FIG. 3) may receive a wireless signal at operation 701. The received wireless signal may be based on a time division multiple access (TDMA) scheme. The wireless signal may be received using at least one of a first antenna (e.g., the first antenna 410 in FIG. 4) and a second antenna (e.g., the second antenna 430 in FIG. 4).

In an embodiment, the processor may determine, at operation 703, whether an electronic device (e.g., the electronic device 300 in FIG. 3) is in a first state (e.g., a state where a folder part (e.g., the folder part 220 in FIGS. 2A and 2B) of the electronic device is overlapped with at least a portion of a main part (e.g., the main part 210 in FIGS. 2A and 2B)).

In an embodiment, when the electronic device is in the first state, the processor may measure the strength of the received wireless signal at operation 705.

In an embodiment, the processor may determine, at operation 707, whether the measured strength does not exceed a reference value. The operation 707 may be operation for determining whether the received signal strength is low or high.

In an embodiment, when it is determined at the operation 707 that the measured strength does not exceed the reference value (e.g., when the received signal strength is low), the processor may control, at operation 709, a low noise amplifier (LNA) of the second antenna (e.g., the LNA 435 of the second antenna 430 in FIG. 4) to be turned off at least temporarily when transmitting a wireless signal through the first antenna, and also control the LNA of the second antenna to be turned on when receiving a wireless signal through the first antenna.

In an embodiment, when it is determined at the operation 707 that the measured strength exceeds the reference value (e.g., when the received signal strength is high), the processor may control, at operation 711, the LNA of the second antenna to be turned off at least temporarily.

In an embodiment, when it is determined at the operation 703 that the electronic device is not in the first state, the processor may determine, at operation 721, that the electronic device is in a second state (e.g., a state where the folder part of the electronic device is not overlapped with at least a portion of the main part), and measure the strength of the received wireless signal.

In an embodiment, the processor may determine, at operation 723, whether the measured strength does not exceed a reference value.

In an embodiment, when it is determined at the operation 723 that the measured strength does not exceed the reference value (e.g., when the received signal strength is low), the processor may control, at operation 725, the LNA of the second antenna to be turned on.

In an embodiment, when it is determined at the operation 723 that the measured strength exceeds the reference value (e.g., when the received signal strength is high), the processor may control, at operation 727, the LNA of the second antenna to be turned off at least temporarily.

In an embodiment, the LNA of the second antenna may be controlled, not only based on the state of the electronic device, but also based on whether the received signal strength is low or high. That is, based on the state of the electronic device (e.g., first state or second state) and the received signal strength (e.g., low or high), it is possible to control the LNA of the second antenna to be turned off at least temporarily. This can improve the RSE performance and also reduce the power consumption.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that the singular form of a noun may also refer to the plural, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together. As used herein, such terms as "1st" and "2nd," or "first" and "second" may refer to corresponding components without implying an order of importance, and are used merely to distinguish each component from the others without unduly limiting the components. It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly via a wire, wirelessly, or via a third element.

As used herein, the term "module" may include a unit implemented in hardware, software, or firmware, and may interchangeably be used with other terms, for example, "logic," "logic block," "part," or "circuitry." A module may be a single integral component or a part thereof adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include code made by a complier or code executable by an interpreter. The machine-readable storage medium may be provided in the form of a non-transitory storage medium. The term "non-transitory" simply means that the storage medium is a tangible device and does not include a signal (e.g., an electromagnetic wave). However this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server. According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a first antenna transmitting and receiving a wireless signal;
a second antenna receiving the wireless signal and including a low noise amplifier (LNA) for amplifying the received wireless signal; and
a processor electrically connected to the first antenna and the second antenna,
wherein the electronic device includes a main part and a folder part both of which are connected through a hinge part,
wherein the processor is configured to:
control the LNA of the second antenna to be turned off at least temporarily during transmission of the wireless signal through the first antenna when the folder part overlaps with at least a portion of the main part, and
control the LNA of the second antenna to be turned on during transmission of the wireless signal through the first antenna when the folder part does not overlap with at least the portion of the main part.

2. The electronic device of claim 1, wherein the processor is configured to control the turned-off LNA of the second antenna to be turned on during reception of the wireless signal through the first antenna when the folder part overlaps with the at least the portion of the main part.

3. The electronic device of claim 1, wherein the processor is configured to:
measure a strength of the received wireless signal when the folder part overlaps with the at least the portion of the main part,
compare the measured strength with a reference value,
when the measured strength is less than or equal to the reference value, control the LNA of the second antenna to be turned off at least temporarily during the transmission of the wireless signal through the first antenna, and control the LNA of the second antenna to be turned on during reception of the wireless signal through the first antenna, and
when the measured strength exceeds the reference value, control the LNA of the second antenna to be turned off at least temporarily.

4. The electronic device of claim 1, wherein the processor is configured to:
measure a strength of the received wireless signal when the folder part is not overlapped with the at least the portion of the main part,
compare the measured strength with a reference value,
when the measured strength is less than or equal to the reference value, control the LNA of the second antenna to be turned on, and
when the measured strength exceeds the reference value, control the LNA of the second antenna to be turned off at least temporarily.

5. The electronic device of claim 1, wherein an appearance of the electronic device is formed of metal.

6. A method for controlling an amplifier based on a state of an electronic device, wherein the electronic device includes a main part and a folder part both of which are connected through a hinge part, the method comprising:
receiving a wireless signal through at least one of a first antenna and a second antenna;
controlling a low noise amplifier (LNA) of the second antenna to be turned off at least temporarily during transmission of the wireless signal through the first antenna when
the folder part is overlapped with at least a portion of the main part; and
controlling the LNA of the second antenna to be turned on during transmission of the wireless signal through the first antenna when the folder part does not overlap with at least the portion of the main part.

7. The method of claim 6, further comprising:
controlling the turned-off LNA of the second antenna to be turned on during reception of the wireless signal through the first antenna when the folder part is overlapped with at least the portion of the main part.

8. The method of claim 6, further comprising:
measuring a strength of the received wireless signal when the folder part is overlapped with at least the portion of the main part;
comparing the measured strength with a reference value;
when the measured strength is less than or equal to the reference value, controlling the LNA of the second antenna to be turned off at least temporarily during the transmission of the wireless signal through the first antenna, and controlling the LNA of the second antenna to be turned on during reception of the wireless signal through the first antenna; and
when the measured strength exceeds the reference value, controlling the LNA of the second antenna to be turned off at least temporarily.

9. The method of claim 6, further comprising:
measuring a strength of the received wireless signal when the folder part is not overlapped with at least the portion of the main part;
comparing the measured strength with a reference value; and
when the measured strength is less than or equal to the reference value, controlling the LNA of the second antenna to be turned on.

10. The method of claim 9, further comprising:
when the measured strength exceeds the reference value, controlling the LNA of the second antenna to be turned off at least temporarily.

11. An electronic device comprising:
a folder part;
a main part connected to the folder part through a hinge part and overlapped with at least a portion of the folder part when the folder part is closed;
a sensor unit for detecting a closed state of the folder part;
a first antenna for transmitting or receiving a first signal;
a second antenna for receiving a second signal;
a communication module for performing communication using the first and second antennas;
an amplifier disposed between the second antenna and the communication module and amplifying the second signal received through the second antenna; and
a processor configured to:
determine whether the folder part is closed using the sensor unit, and
control the amplifier to be turned off at least temporarily when the folder part is closed during transmission of the first signal through the first antenna,
wherein the processor is configured to control the amplifier to be turned on when the folder part is opened during transmission of the first signal through the first antenna.

12. The electronic device of claim 11, wherein the processor is configured to control the turned-off amplifier to be turned on when receiving the first signal through the first antenna is closed.

* * * * *